(12) United States Patent
Malone

(10) Patent No.: US 6,659,659 B1
(45) Date of Patent: Dec. 9, 2003

(54) HIGH-SPEED OPTICAL SUB-ASSEMBLY UTILIZING CERAMIC SUBSTRATE, DIRECT COUPLING AND LASER WELDING

(75) Inventor: Kevin J. Malone, Boulder, CO (US)

(73) Assignee: Optical Communication Products, Inc., Whatsworth, CA (US)

( * ) Notice: Subject to any disclaimer, the term of this patent is extended or adjusted under 35 U.S.C. 154(b) by 61 days.

(21) Appl. No.: 10/072,054

(22) Filed: Feb. 5, 2002

Related U.S. Application Data

(60) Provisional application No. 60/309,962, filed on Aug. 1, 2001, and provisional application No. 60/283,449, filed on Apr. 11, 2001.

(51) Int. Cl.[7] ............................................. G02B 6/36
(52) U.S. Cl. ........................... 385/94; 385/88; 385/60; 372/50; 257/432
(58) Field of Search ............................... 385/88–94, 78, 385/60, 52; 372/6, 50, 43, 96; 257/433, 432, 678, 99

(56) References Cited

U.S. PATENT DOCUMENTS

| | | | |
|---|---|---|---|
| 5,305,406 A | 4/1994 | Rondeau | 385/81 |
| 5,577,064 A | 11/1996 | Swirhun et al. | 372/96 |
| 5,606,572 A | 2/1997 | Swirhun et al. | 372/96 |
| 5,631,987 A | 5/1997 | Lasky et al. | 385/88 |
| 5,812,582 A * | 9/1998 | Gilliland et al. | 372/50 |
| 5,814,871 A * | 9/1998 | Furukawa et al. | 257/433 |
| RE36,231 E | 6/1999 | Rondeau | 385/81 |
| 5,943,357 A | 8/1999 | Lebby et al. | 372/50 |

* cited by examiner

*Primary Examiner*—Phan T. H. Palmer
(74) *Attorney, Agent, or Firm*—Barlow, Josephs & Holmes, Ltd.

(57) ABSTRACT

An optical subassembly (OSA) includes a ferrule, an optical fiber, a ceramic substrate, and a seal coupled to the ceramic substrate. A weld sleeve is used to fixably couple the ferrule to the seal ring, for which the weld sleeve may be laser welded to the ferrule and/or the seal ring. The OSA may be a transmitter OSA or a receiver OSA, and may be hermetically sealed.

24 Claims, 7 Drawing Sheets

HIGH-SPEED OPTICAL SUB-ASSEMBLY UTILIZING CERAMIC SUBSTRATE, DIRECT COUPLING AND LASER WELDING

CROSS-REFERENCE TO RELATED APPLICATIONS

This application claims priority of U.S. Provisional Patent Application No. 60/309,962 entitled "High-Speed Optical Sub-Assembly Utilizing Ceramic Substrate, Direct Coupling and Laser Welding," filed on Aug. 1, 2001, the contents of which are hereby incorporated by reference. This application contains subject matter related to the subject matter disclosed in U.S. patent application Ser. No. 09/969,085 entitled "High Speed Optical Subassembly with Ceramic Carrier" filed Oct. 1, 2001 and U.S. Provisional Patent Application No. 60/283,449 entitled "Applications for LW VCSELs" filed Apr. 11, 2001, the contents of both of which are hereby incorporated by reference.

FIELD OF THE INVENTION

The present invention relates generally to sub-assemblies used to transfer light between an optoelectronic converter and an optical fiber. More particularly, it relates to optical sub-assemblies (OSAs) comprising a vertical cavity surface emitting laser (VCSEL)

BACKGROUND OF THE INVENTION

Many different types of optical sub-assemblies suitable for packaging semiconductor lasers have been developed and/or considered by various different groups. In general, these OSAs can be divided into two classes: coaxial OSAs and in-line OSAs. Coaxial OSAs are usually based around a TO (transistor outline) package, which may also be referred to as a TO can. The OSAs containing lasers may also be referred to as transmitter optical sub-assemblies (TOSAs).

Coaxial packages are well suited for vertical cavity surface emitting lasers (VCSELs) since the VCSEL can be mounted directly on a header, with the emission directed out through a window. However, the coaxial, TO type packages typically have poor high-frequency performance characteristics. For example, the high-frequency bandwidth of TO-46 and TO-56 packages may reach a maximum of about 1.5 GHz using typical drive currents and standard mounting configurations. Thus, TO packages are unsuitable for packaging VCSEL sources that are modulated at 10 gigabits per second (Gbps) or higher data rates. Receptacle-type OSAs that use TO packages are similarly limited by the relatively low bandwidth of the TO packages.

In-line packages are typically used for high-speed, edge-emitting laser sources, and typically have a "pigtail" of optical fiber that is permanently attached to the laser. The frequency response of these packages typically allows edge-emitting lasers to be driven at 10 Gbps. However, the cost of these packages, which are typically machined from several pieces of Kovar®, can be quite high (typically $20–$30 per package in high volume). Kovar® is a registered trademark of CRS Holdings, Inc., Wilmington, Del. Further, the basic geometry of the package is designed for edge-emitting lasers. VCSELs can also be used in these packages However, the assembly is typically more complicated than the case of edge emitting lasers, and in-line packages designed for VCSELs may also be relatively expensive.

Most optical sub-assemblies used for coupling the light from an edge-emitting laser diode to a single-mode optical fiber use a lens. The optical fiber can in fact be placed directly in front of the light-emitting facet of an edge-emitting laser diode, however, the coupling efficiency is typically only 10%. This is due to the difference in the mode field diameters of the laser and the optical fiber, and also the astigmatism of the emission from the laser.

The lens is used to convert the size of the laser emission so that it more closely matches the mode field diameter of the optical fiber. Standard "spherical" lenses or aspheric lenses are often used for this purpose. The lens adds significant cost to the OSA. Lenses may also require the use of an optical isolator in order to reduce relative intensity noise (RIN) to acceptable levels. Optical isolators typically cost about $100, and tend to significantly increase the cost of OSAs containing them.

Optoelectronic components used in fiber optic communication transmitters and/or receivers are typically required to perform in varying environmental conditions and within tight specifications and tolerances. Thus, when the optoelectronic components are mounted in an OSA, accumulation of moisture within the OSA may have a detrimental effect on such components.

SUMMARY

In an exemplary embodiment according to the present invention, an OSA includes a ferrule, an optical fiber disposed within the ferrule, a ceramic or ceramic-like substrate, a seal coupled to the ceramic substrate, and a weld sleeve coupled to the seal and the ferrule. An OSA assembly according to the present invention may advantageously permit a VCSEL mounted on the ceramic substrate to emit light perpendicular to the surface of the ceramic substrate for receipt by an optical fiber.

In another exemplary embodiment according to the present invention, an OSA is provided comprising a ferrule having a substantially cylindrical shape, a weld sleeve, and a microwave-capable ceramic substrate. The weld sleeve comprises a substantially cylindrical member, which is co-axial to and at least partially envelopes the ferrule. The weld sleeve further comprises a flange on one end. The weld sleeve is capable of being laser welded to the ferrule. A seal is mounted on the microwave-capable ceramic substrate, and is capable of being laser welded to the flange.

In still another exemplary embodiment according to the present invention, a transmitter optical subassembly (TOSA) includes a ceramic substrate; a VCSEL mounted on the ceramic substrate, the VCSEL positioned to emit light substantially perpendicular to the surface of the ceramic substrate on which the VCSEL is mounted; a ferrule; and an optical fiber disposed within the ferrule, the ferrule positioned such that an end face of the optical fiber receives light emitted by the VCSEL.

In yet another exemplary embodiment according to the present invention, a method of assembling an OSA is provided. An optical fiber is coarsely aligned with a VCSEL in at least an X-Y direction. The optical fiber is hermetically sealed to a ferrule and the VCSEL is mounted on a ceramic substrate, which has a seal mounted thereon. The distance between the optical fiber and the VCSEL is adjusted in a Z direction until sufficient coupling efficiency is achieved. A weld sleeve is slid over the ferrule to position the weld sleeve on the seal. The weld sleeve is then laser welded to the ferrule, thereby fixing a distance between the optical fiber and the VCSEL in the Z direction. The optical fiber is finely aligned to the VCSEL in at least the X-Y direction. The weld sleeve is then laser welded to the seal.

DETAILED DESCRIPTION

Figure 1:
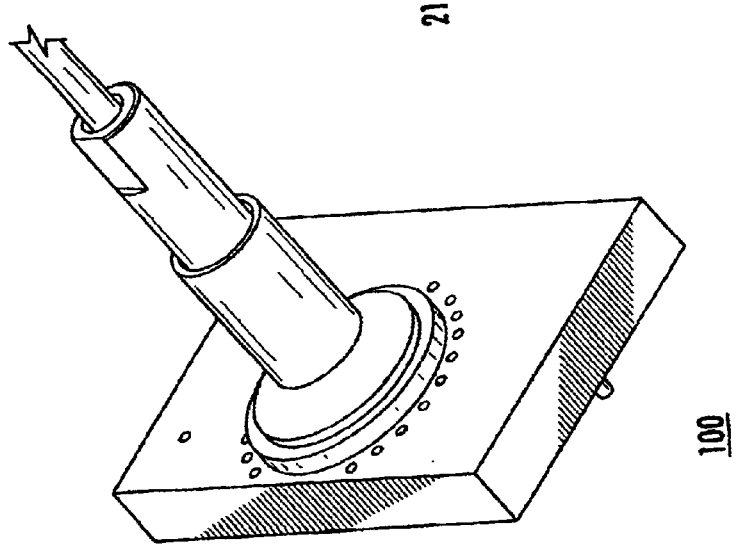
FIG. 1 illustrates an optical sub-assembly (OSA) in an exemplary embodiment according to the present invention.

FIG. 1 illustrates an optical sub-assembly (OSA) 100 in an exemplary embodiment according to the present invention. The OSA 100, for example, may take the form of a long wave (LW) transmitter OSA (TOSA) that efficiently couples a LW VCSEL to an optical fiber. When the OSA 100 is used as a TOSA, the OSA 100 may comprise a ceramic or ceramic-like substrate, a VCSEL, a monitor photodiode, a spacer, a weld sleeve and a fiber/ferrule assembly. The ceramic substrate may be a microwave-capable to enable operation at high speeds, such as 10 Gbps or faster. In other embodiments, the OSA 100 may include a short wave (SW) laser for application as a SW TOSA or a receiver photodiode for application as a receiver OSA (ROSA).

Figure 2:
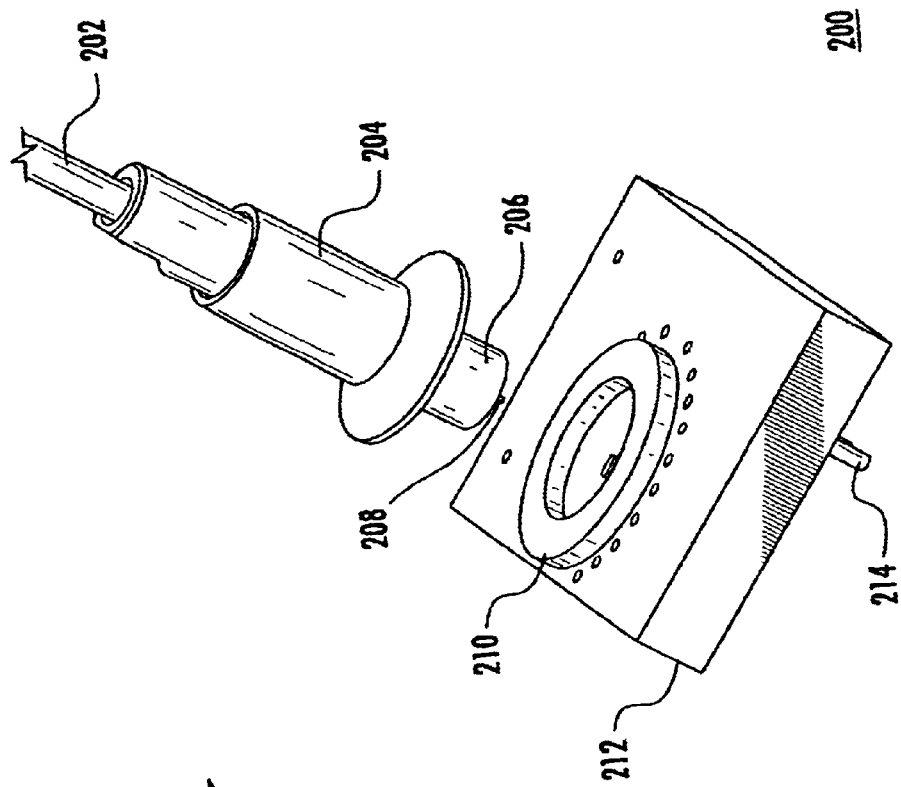
FIG. 2 is a pre-assembly view of the exemplary OSA of FIG. 1.

FIG. 2 illustrates a pre-assembly view 200 of the exemplary OSA 100 of FIG. 1. The OSA 200 comprises a single-mode fiber (SMF) or multi-mode fiber (referred to generically as optical fiber 208) enclosed in a buffer 202, a weld sleeve 204, a ferrule 206, a seal, such as a seal ring 210, a ceramic substrate 212 and pins 214. In other embodiments, the optical fiber 208 may be enclosed in different types of material. In pre-assembled form, the weld sleeve 204 is movable with respect to the ferrule 206.

The ceramic substrate 212 is illustrated as having a rectangular shape; however in practice, the ceramic substrate 212 may be circular, elliptical, or have any other suitable shape. Use of the ceramic substrate 212 in an optical subassembly may contribute to a reduction in fabrication costs since ceramic substrate can be manufactured as a large ceramic plate, then divided into smaller ceramic substrates.

The weld sleeve 204, the ferrule 206, the seal ring 210 and the pins 214 may be fabricated from Kovar, and may be gold (Au) or Nickel (Ni) plated, for example, to prevent rusting. The ferrule 206 encloses a portion of an optical fiber 208 not fully enclosed by the tight buffer. The combination of the optical fiber 208 and the enclosing, ferrule is typically referred to as a fiber/ferrule assembly.

For example, the weld sleeve 204 may be machined from Kovar, 304L stainless steel, or like materials. Kovar has a CTE (coefficient of thermal expansion) that is matched to ceramic (alumina), and it is easily laser welded. However, Kovar is a relatively expensive material. The 300-series of stainless steels are currently more cost-effective than Kovar and can also be laser welded. The "L" suffix indicates "low carbon" content that is beneficial for laser welding. Many other metals (e.g., Alloy 42 or Alloy 52) could be substituted for Kovar or 304L, however, any substitution for Kovar or 304L should be suitable for laser welding.

The optical fiber 208 of the disclosed embodiment protrudes slightly (e.g., ~500 um) from the end of the ferrule 206, so that the end-face of the optical fiber 208 can be positioned proximate to the VCSEL, while keeping the ferrule from touching wire-bonds between the ceramic substrate and the VCSEL and/or other optoelectronic devices. The end-face of the optical fiber may be polished (or cleaved) at a small angle (for example, approximately 3° to approximately 10°) in order to prevent a reflection from the fiber end-face from coupling back into the laser cavity.

The ferrule 206 may be fabricated from zirconium oxide or metals (for example, ARCAP, Kovar or stainless steel). ARCAP is a copper/nickel alloy that is commonly used for metal optical fiber ferrules, such as, for example, those used in ST optical fiber connectors.

The hermetic sealing of the exemplary OSA 100 (e.g., to promote long product lifetime) is attained by sealing the seam between the seal ring 210 and the weld sleeve 204, as well as the seam(s) between the weld sleeve 204 and the ferrule 206. In this manner, no other components than those that are already available are required for hermetically sealing the OSA.

Since the optical fiber 208 passes through the ferrule 206, optical fiber should be hermetically sealed in the ferrule 204. The optical fiber 208 may first be gold-coated and soldered into a metal tube. The metal tube may then be soldered to the ferrule 206. An example of this type of hermetic sealing is disclosed in "Thermally Induced Stresses in an Optical Glass Fiber Soldered into a Ferrule," E. Suhir, J. Lightwave Technol.,Vol.12, No. 10, p. 1766, 1994, the contents of which are incorporated by reference herein. In other embodiments, the optical fiber 208 may be soldered to the ferrule 206 via glass soldering, in which lead-containing glass is used for soldering.

In other embodiments, a technique known as "impact mounting" may also be used to hermetically seal the optical fiber 208 to the ferrule 206 as described, for example, in U.S. Pat. No. 5,305,406 and U.S. Reissue Patent No. RE036231. In this technique, the ferrule 206 is mechanically deformed around the glass optical fiber, thereby producing a hermetic seal.

Figure 3:
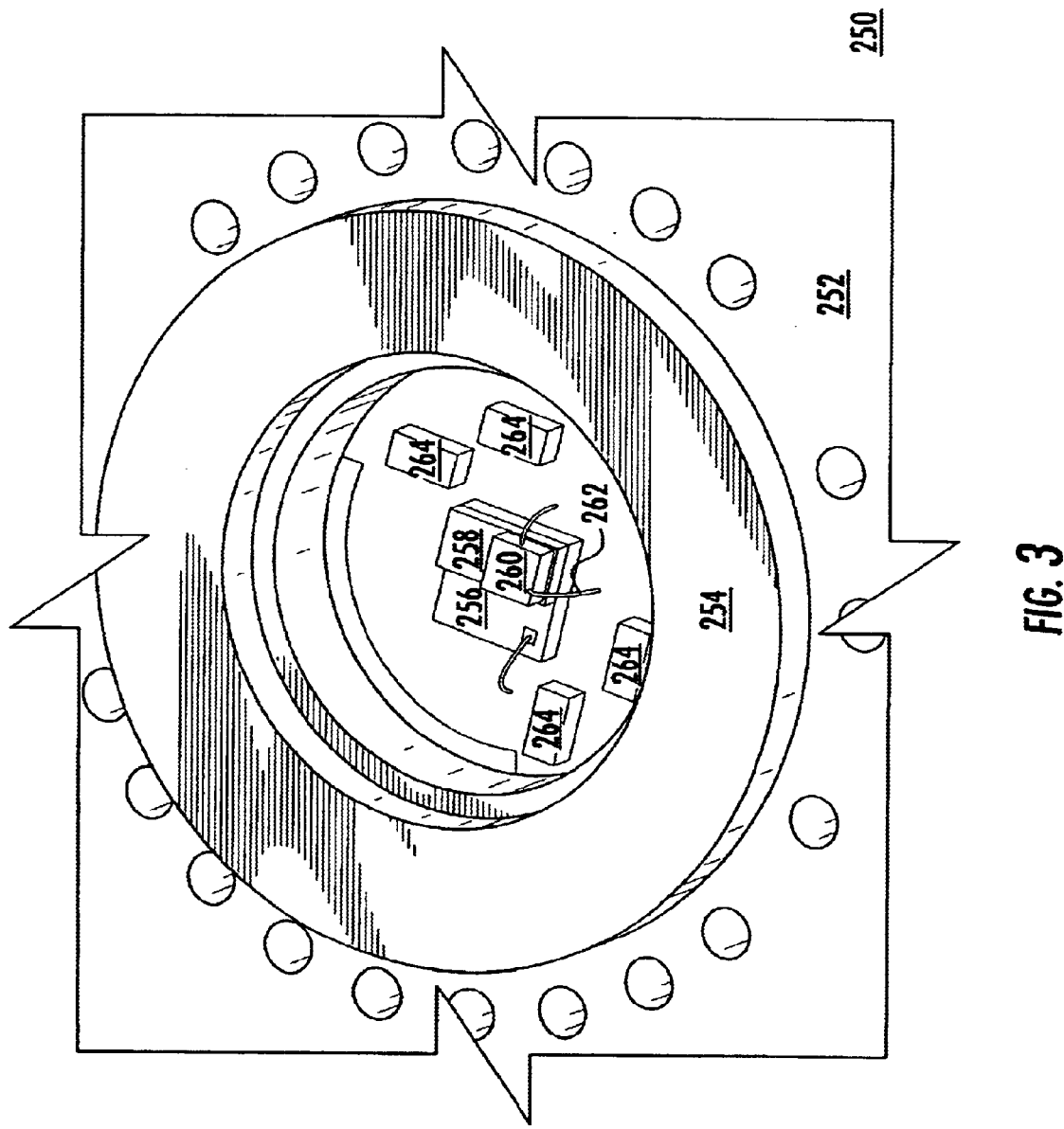
FIG. 3 illustrates certain components inside the exemplary OSA of FIG. 1, when the OSA is used as a transmitter optical subassembly (TOSA)

FIG. 3 illustrates a ceramic assembly 250 including a ceramic substrate 252, which may represent the ceramic substrate 212 in the OSA 200 of FIG. 2, and components mounted on the ceramic substrate 252. The ceramic substrate 252 has a cavity in which a monitor photodiode 256, a spacer 258 and a VCSEL 260 are mounted.

As illustrated in FIG. 3, ball-stitch bonds 262 may be used to make electrical connections from the VCSEL 260 and the monitor photodiode 256, respectively, to the ceramic substrate 252. The ball-stitch bonds 262, for example, may be formed from a suitable conducting material, such as 0.8 mil Au wires. The ball stitch bonds 262 function to provide electrical coupling between control and driver circuitry (not shown) and the VCSEL 260 and monitor photodiode 256. The passive components 264 (e.g., resistors, capacitors and/or inductors) may be used to match the impedance of the VCSEL to the ceramic/printed circuit board (PCB). The passive components 264 may also be used to improve the high-frequency performance of the TOSA by acting as a filter. For example, the passives 264 in an exemplary embodiment may comprise 2.3 nH (nano Henry) 0201 inductors and 155 ohm 0201 resistors.

The ceramic substrate should have a constant impedance, low microwave losses and fast electrical rise time, and should enable operation of the VCSEL 260 at 10 Gbps and/or higher data rates. The ceramic substrate 252 in an exemplary embodiment according to the present invention comprises ceramic material similar to the ceramic material disclosed in commonly-owned, previously-incorporated U.S. patent application Ser. No. 09/969,085. For example, the ceramic substrate 252 may be fabricated using either low-temperature co-fired ceramic (LTCC) or high-temperature co-fired ceramic (HTCC). In other embodiments, the ceramic substrate may be made using any other suitable type of ceramic.

The seal ring 254 allows a weld sleeve, such as the weld sleeve 204 of FIG. 2, to be laser welded to the ceramic substrate 252. The seal ring 254 and the electrical pins, such as the pins 214 of FIG. 2, may be attached to the ceramic using standard brazing techniques or any other suitable technique for forming metal-to-ceramic joints. The seal ring 254, for example, may be fabricated from Kovar, 304L stainless steel, or any other suitable stainless steel or other laser weldable material.

The VCSEL 260 in an exemplary embodiment according to the present invention is a single transverse mode long wave VCSEL, which may operate at ~1.3 $\mu$m (1310 nm) at a data rate of 10 Gbps. For example, the 10 Gbps VCSEL may be similar to the one disclosed in commonly-owned, previously-incorporated U.S. Provisional Patent Application No. 60/283,449.

The VCSEL may have both the anode and cathode contacts on its top surface for wirebonding to the ceramic substrate. The VCSEL may be fabricated on a gallium arsenide (GaAs) substrate, which is transparent to radiation at ~1.3 $\mu$m, allowing laser light emitted from the lower DBR (distributed Bragg reflector) to pass through the substrate.

The mode field diameter of the VCSEL is generally circular in shape, and its size can be substantially matched to that of a single-mode optical fiber. Such matching may allow for high coupling efficiency between the VCSEL and the optical fiber. Using direct coupling, the coupling efficiency between the ~1.3 $\mu$m single transverse mode LW VCSEL and a single mode fiber may be improved as the mode field of the VCSEL gets closer to the mode field of the single mode fiber (typically ~9 $\mu$m).

The coupling efficiency, for example, may be between 50% and 70%. The coupling efficiency may be higher (or lower) in other embodiments. For example, the coupling efficiency between a ~1.3 $\mu$m single transverse mode long wave (LW) VCSEL and a single mode fiber may be 50%, with the coupling efficiency improving as the mode field diameter of the VCSEL gets closer to the mode field diameter of the single mode fiber. In order to increase coupling efficiency between the light from the VCSEL 260 and the fiber, such as the fiber 208 of FIG. 2, the fiber interfacing with the VCSEL may be angled or cleaved. The slope of the angle, for example, may be 3 to 10 degrees. The angling of the fiber may also reduce relative intensity noise (RIN).

The VCSEL 260 may comprise an array of VCSELS in an exemplary embodiment for transmitting multiple channels of high speed data. Of course, to interface with the multiple channels of VCSELs, the fiber/ferrule assembly would include a corresponding number of optical fibers.

In the case of VCSELs formed on substrates (e.g., GaAs) that are transparent at the wavelength of operation, the emission directed out of the back of the substrate can be monitored for automatic power control. The monitor photodiode 256 may be used to implement automatic power control of the TOSA. The monitor photodiode 256, for example, may be fabricated on an indium phosphate (InP) substrate using standard techniques that are known to those skilled in the art. The monitor photodiode 256 may also be referred to as a monitor photodetector, a monitor detector, a PIN detector, or a monitor diode. Similar references apply to the receiver photodiode when the OSA 100 is configured as ROSA.

The anode contact of the exemplary monitor photodiode is on the top of the photodiode, while the cathode contact is on the back of the photodiode. In other embodiments, both the anode and cathode contacts may be on the top or bottom of the photodiode.

The active area of the monitor photodiode 256 should be large enough so that the backward propagating VCSEL beam lies almost entirely on the active area. The active area (InGaAs light-sensitive region) in the exemplary embodiment is approximately 300 $\mu$m in diameter. Active areas in other embodiments may be more or less than 300 $\mu$m in diameter. The monitor photodiodes in other embodiments may also be made of other photo-sensitive materials, such as germanium (Ge).

The spacer 258 in the exemplary embodiment may be manufactured from a thin (e.g., ~200 $\mu$m) slice of silicon. The spacer 258 in other embodiments may have different thickness and/or may be fabricated using different material. The spacer 258 of this disclosed embodiment is polished on both sides. Without polishing, the light from the VCSEL 260 may be scattered, and this may prevent some of the light from reaching the monitor photodiode.

Silicon is transparent to all wavelengths greater than approximately 1.1 $\mu$m. This means that the spacer 258, when made of silicon is transparent to the ~1.3 $\mu$m radiation. The thermal conductivity of silicon is about 150 W/m-K. The thermal conductivity of InP is about 70 W/m-K and of GaAs is about 54 W/m-K. Thus the spacer 258, when made of silicon, allows efficient heat removal from the VCSEL while also allowing the ~1.3 $\mu$m radiation to pass through to the monitor photodiode 256. Otherwise, due to the moderate thermal conductivity of InP material, which prevents significant amounts of heat from being extracted from the VCSEL, the lifetime of the VCSEL may be decreased.

In other embodiments, however, the spacer 258 may not be used, and the VCSEL 260 may be mounted directly on the monitor photodiode 256 using transparent epoxy. In still other embodiments, the monitor photodiode 256 may not be used if the laser output can be sufficiently controlled as an open loop system without using automatic power control or feedback loop. As will be recognized by those skilled in the art, many other configurations are possible for mounting the VCSEL 260 and any other desired components to the ceramic substrate 252, and the particularized arrangement and number of components is not considered critical to the invention.

Figure 4:
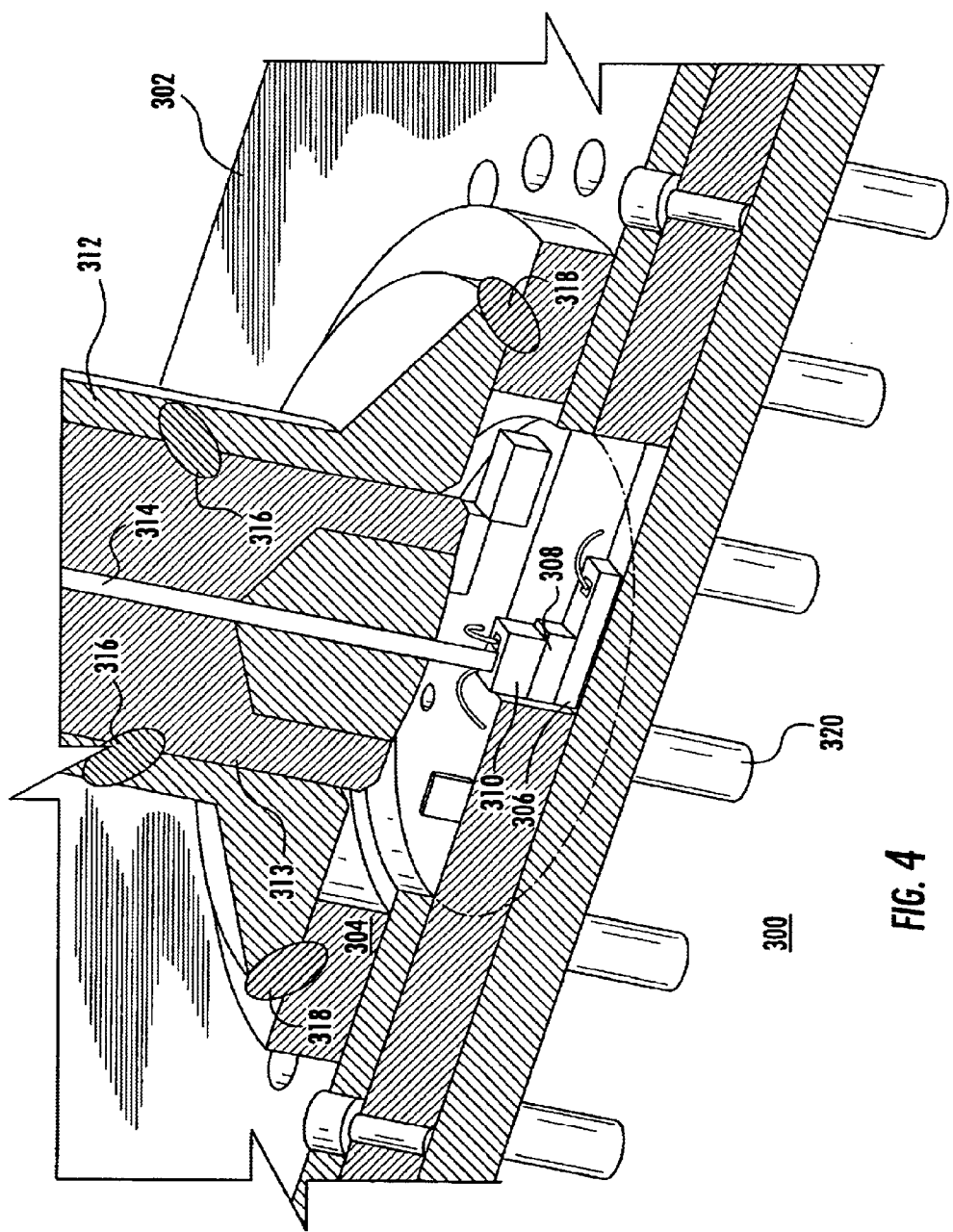
FIG. 4 illustrates a cross-sectional view of the exemplary OSA of FIG. 1, when the OSA is used as a TOSA.

FIG. 4 illustrates a cross-sectional view of a TOSA 300 in an exemplary embodiment according to the present invention. The TOSA 300 includes a fiber/ferrule assembly 313, which includes a fiber 314 enclosed by a ferrule. The TOSA 300 also includes a weld sleeve 312. The fiber/ferrule assembly 313 is laser welded to a seal ring 304 mounted on a ceramic substrate 302. The ceramic substrate 302 has pins 320 mounted thereon for mounting/interfacing, for example, to a printed circuit board. The ceramic substrate 302 has a cavity formed thereon, and a monitor photodiode 306, a spacer (e.g., silicon spacer) 308 and a VCSEL 310 are mounted therein.

The weld sleeve 312 in the exemplary embodiment is laser welded to the seal ring 304 and the fiber/ferrule assembly 313. For example, the laser welds may include X-Y welds 318 for keeping alignment between the optical fiber 314 and the VCSEL 310 in the X-Y direction and Z welds 316 for keeping alignment between the optical fiber 314 and the VCSEL 310 in the Z direction. The Z welds 316 are used to attach the fiber/ferrule assembly 313 to the weld sleeve 312. The X-Y welds 318 are used to attach the weld sleeve 312 to the seal ring 304. The laser welding, for example, may be performed using a LW-4000™ laser welder available from Newport Corporation, Irvine, Calif., or any other suitable laser welder. LW-4000™ is a trademark of Newport Corporation, Irvine, Calif.

Figure 5:
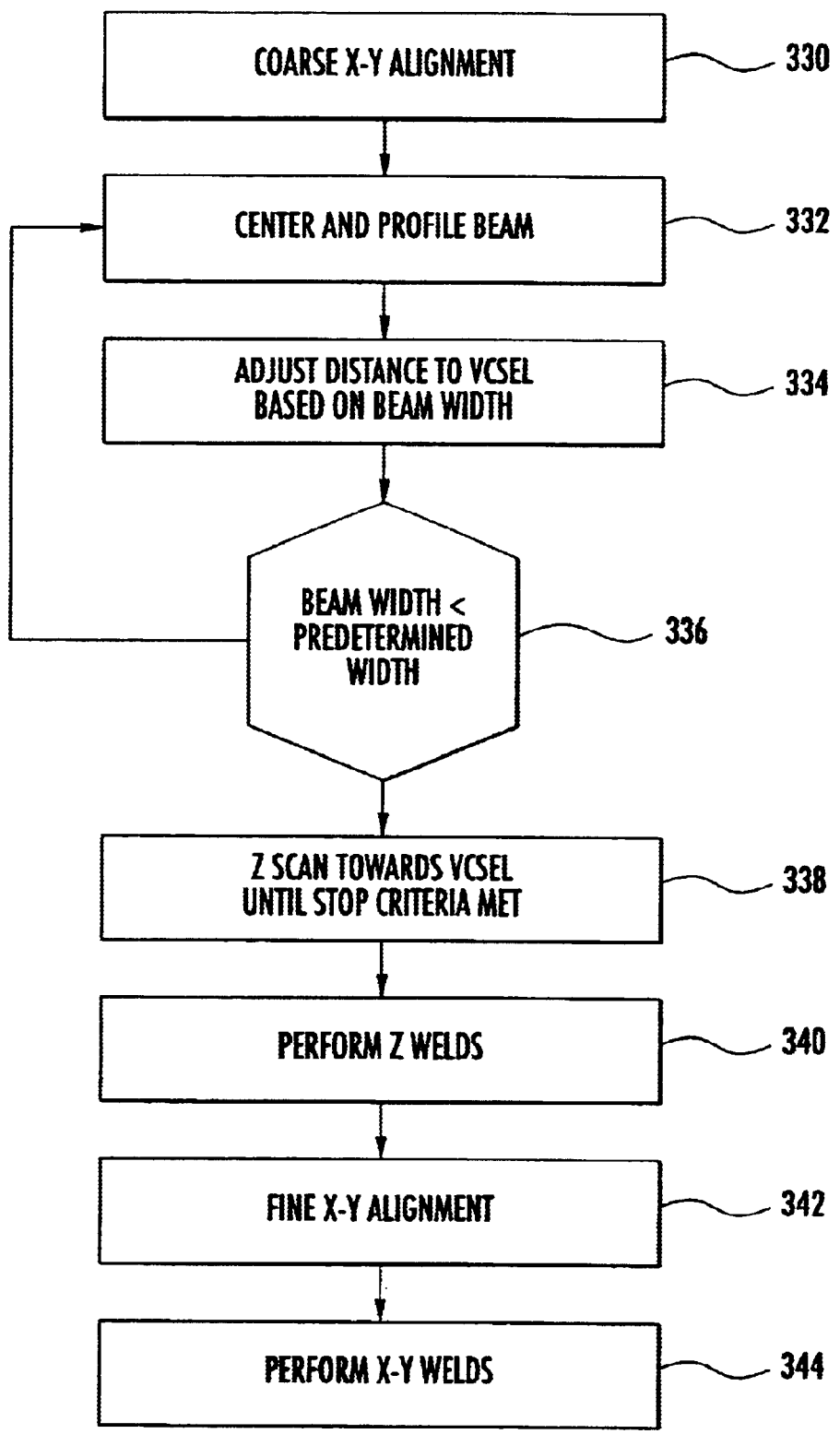
FIG. 5 is a flow diagram illustrating a process of welding a TOSA in an exemplary embodiment according to the present invention.

FIG. 5 is a flow diagram illustrating a process of laser welding the weld sleeve 312 to the fiber/ferrule assembly 313 and the seal ring 304 in an exemplary embodiment according to the present invention. The VCSEL is powered to generate a laser beam output for active alignment, in which the detected VCSEL output is used to align the optical fiber to the VCSEL.

In step 330, the fiber/ferrule assembly 313 is coarsely aligned to the ceramic substrate in the X-Y direction, in which the alignment is made between the VCSEL 310 and the fiber 314 to find the approximate centroid of the VCSEL beam. During this alignment, the optical fiber 314 and the VCSEL 310 may be separated by a relatively long distance.

In step 332, the beam is centered and profiled to determine the width of the beam in X and Y directions. In step 334, the distance between the VCSEL 310 and the end of the fiber 314 is adjusted based on the beam width, with the goal of reducing the beam width to be less than a predetermined width. In step 336, the steps of profiling the beam and adjusting the distance are performed repeatedly (e.g., 2 or 3 times) until the beam width is less than the predetermined width. The measured beam width is the convolution of the mode field diameter (MFD) of the VCSEL and the MFD of the optical fiber. For example, a predetermined width of 5 $\mu$m may be selected by a user. However, the exact value of the predetermined width is not important for the purposes of the described embodiment.

Once the beam width is brought to less than the predetermined width, the fiber/ferrule assembly 314 is moved towards the VCSEL 310. The optical power can be recorded while the fiber is moved towards the VCSEL in step 338. Characteristics of the optical power vs. Z distance can be used to ensure that the fiber does not touch the VCSEL. For example, small Fabry-Perot resonances can be observed. The characteristics of these resonances change when the fiber is within several micrometers of the surface of the VCSEL. These changes can be used to stop the alignment producing high coupling efficiency without the fiber touching the VCSEL. Other stopping criteria can also be used, such as aligning the fiber to the VCSEL until the fiber-coupled optical power reaches some threshold value.

When the stop criteria are met, laser welds are performed (e.g., Z welds 316) in step 340 to fix the fiber/ferrule assembly 313 to the weld sleeve 312. First, upon reaching a satisfactory distance in the Z direction between the fiber 314 and the VCSEL 310, the weld sleeve 312 is moved with respect to the fiber/ferrule assembly 313 to touch the surface of the seal ring 304. The weld sleeve is then laser welded to the fiber/ferrule assembly 313. By laser welding the weld sleeve 312 to the fiber/ferrule assembly 313 at this point, the alignment (distance) between the fiber 314 and the VCSEL 310 is fixed in the Z-direction.

The laser welding may be performed at a location (e.g., Z welds 316 of FIG. 4) where the fiber/ferrule assembly 313 is completely enclosed by the weld sleeve 312, since laser welding may be performed through a surface (e.g., having a thickness of approximately 250 $\mu$m to 300 $\mu$m) of an object to another object on the other side of the object surface.

If a laser output is applied for laser welding in only one direction, optical misalignment may result. The welding laser melts the metal in a small area. When this melted metal solidifies, it may shrink slightly producing what is known as "post-weld shift" which can cause optical misalignment and a reduction in the output power of the TOSA. Therefore, in the described exemplary embodiment, three laser beams, each with equal power, may be applied from three different 120-degree apart directions to balance in X-Y plane the forces exerted on the fiber/ferrule assembly 313 and the weld sleeve 312.

After the weld sleeve 312 is welded to the fiber/ferrule assembly 313, soldering may be applied in the exemplary embodiment on a seam between the two in order to provide hermetic sealing. The hermetic sealing may also be provided through laser welding or other suitable sealing methods. Moisture resistant adhesives such as MC723™ manufactured by Honeywell are known as "lid sealants". M723™ is a trademark of Honeywell Electronics Materials, Sunnyvale, Calif. This and other adhesives can provide a moisture-proof barrier on the seams between the weld sleeve and the ferrule, and between the weld sleeve and the seal ring. Of course, the hermetic sealing between the weld sleeve 312 and the fiber/ferrule assembly 313 may be performed after the weld sleeve 312 is attached to the seal ring 304.

In step 342 of this embodiment of the invention, the relative positions between the fiber 314 and the VCSEL 310 are finely aligned in the X-Y direction using active alignment. At the end of the fine alignment, X-Y welds 318 are applied to attach the weld sleeve 312 to the seal ring 304. During this laser welding, the laser beams may be applied to and through the weld sleeve 312 to attach the underlying seal ring 304 to the weld sleeve 312.

In the exemplary embodiment, the seam between the weld sleeve 312 and the seal ring 304 is solder-sealed to form a hermetic sealing. In other embodiments, the hermetic sealing may be provided through laser welding or other suitable sealing methods.

For illustrative purposes only, two Z welds 316 and two X-Y welds 318 are shown in FIG. 4. In practice, however, multiple (e.g., 3) laser outputs may be applied simultaneously to balance the forces exerted in the X-Y plane, similar to the case of X welds. It is to be understood that different numbers of Z welds (e.g., 12) and X-Y welds (e.g., 3) may be performed in the exemplary embodiments.

Figure 6:
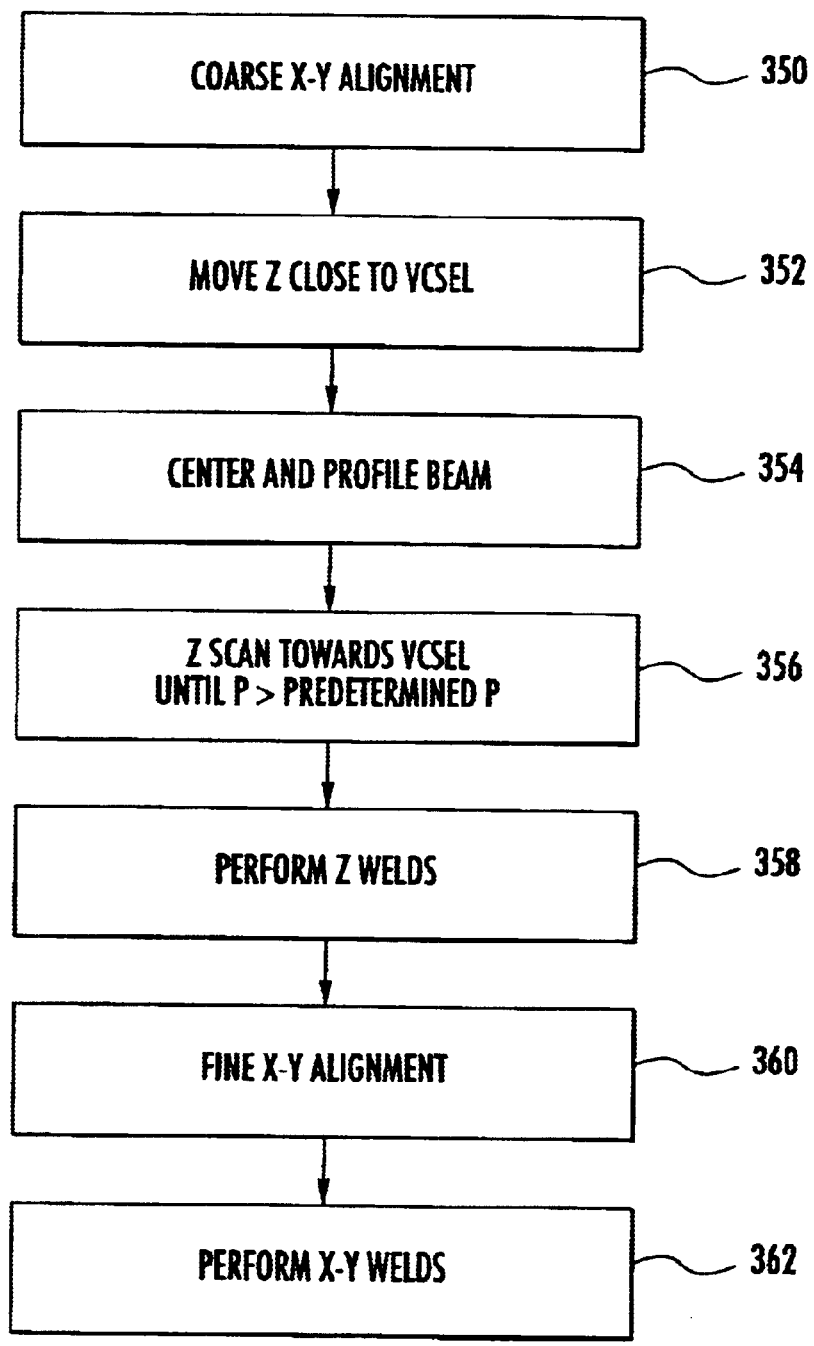
FIG. 6 is a flow diagram illustrating a process of welding a TOSA in another exemplary embodiment according to the present invention.

FIG. 6 is a flow diagram illustrating a process of laser welding the weld sleeve 312 to the fiber/ferrule assembly 313 and the seal ring 304 in another exemplary embodiment according to the present invention. Power is applied to the VCSEL 310 to generate a laser beam output for active alignment. In step 350, the fiber/ferrule assembly 313 is coarsely aligned in the X-Y direction to the ceramic substrate 302, in which the alignment is made between the VCSEL 310 and the fiber 314.

In step 352, the fiber/ferrule assembly 313 is moved close to the ceramic substrate so the end-face of the fiber 314 is sufficiently proximate (e.g., less than 10 μm) to the VCSEL 310. In step 354, the beam is centered and profiled to determine the width of the beam in X and Y directions. In step 356, the fiber/ferrule assembly 313 is Z scanned towards the VCSEL 310 until the measured power from the VCSEL is higher than a predetermined power. The predetermined power in the described embodiment may be 500 μW, for example. However, the exact magnitude of the predetermined power is not important for the purposes of the described embodiment.

When the output power of the laser is greater than the predetermined power, laser welding is performed at the Z welds 316 in step 358 to fix the weld sleeve 312 to the fiber/ferrule assembly 313. First, the weld sleeve 312 is moved with respect to the fiber/ferrule assembly 313 to touch the surface of the seal ring 304. The weld sleeve 312 is then laser welded to the fiber/ferrule assembly 313. By laser welding the weld sleeve 312 to the fiber/ferrule assembly 313 at this point, the alignment (distance) between the fiber 314 and the VCSEL 310 is fixed in the Z-direction.

The laser welding may be performed at a location (e.g., Z welds 316 of FIG. 4) where the fiber/ferrule assembly 313 is completely enclosed by the weld sleeve 312, since laser welding may be performed through a surface (e.g., having a thickness of 250 μm to 300 μm) of an object to another object on the other side of the object surface. After the weld sleeve 312 is welded to the fiber/ferrule assembly 313, soldering may be applied in the exemplary embodiment on a seam between the two in order to provide hermetic sealing. The hermetic sealing may also be provided through laser welding or other suitable sealing methods. Again, the hermetic sealing between the weld sleeve 312 and the fiber/ferrule assembly 313 may be performed after the weld sleeve 312 is attached to the seal ring 304.

In step 360, the relative positions between the fiber 314 and the VCSEL 310 are finely aligned in the X-Y direction using active alignment. At the end of the fine alignment, the relative position is fixed by performing laser welding at X-Y welds 318 in step 362. During this laser welding, the laser beams may be applied to and through the weld sleeve 312 to attach the underlying seal ring 304 to the weld sleeve 312.

In the exemplary embodiment, the seam between the weld sleeve 312 and the seal ring 304 is solder-sealed to form a hermetic sealing. In other embodiments, the hermetic sealing may be provided through laser welding or other suitable sealing methods.

Figure 7:
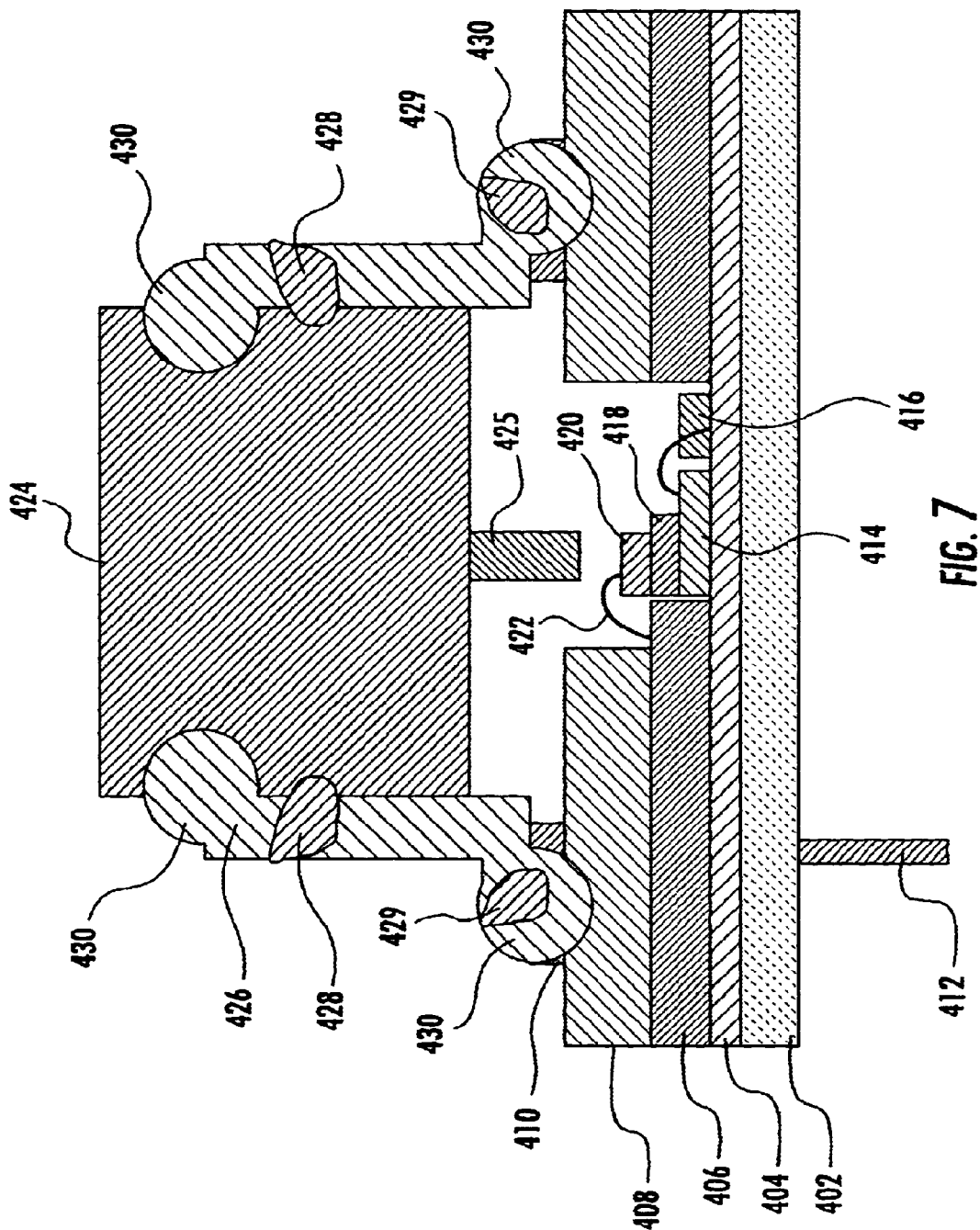
FIG. 7 illustrates a cross-sectional view of a TOSA in an exemplary embodiment according to the present invention.

FIG. 7 is a cross-sectional view of a TOSA 400, illustrating a fiber/ferrule assembly coupled to stacked layers of certain components mounted on a ceramic substrate 402, in an exemplary embodiment according to the present invention. The ceramic substrate, for example, may comprise a ground plane layer and have a thickness of approximately 396 μm. Pins 412 are coupled (e.g., through brazing) to the ceramic substrate 402 for mounting the assembled TOSA on a PCB, for example.

Prior to the fabrication of other components, the ceramic substrate 402 has mounted thereon a monitor diode layer 404 which, for example, may have a thickness of approximately 254 μm, a wire bond shelf 406 which, for example, may have a thickness of approximately 381 μm, a top layer 408 which, for example, may have a thickness of approximately 762 μm, and a seal ring 410, which for example, may have a thickness of approximately 500 μm. The seal ring 410 may be fabricated from a laser weldable material such as Kovar or 304L stainless steel, and may be mounted on the ceramic substrate 402 through brazing.

Figure 8:
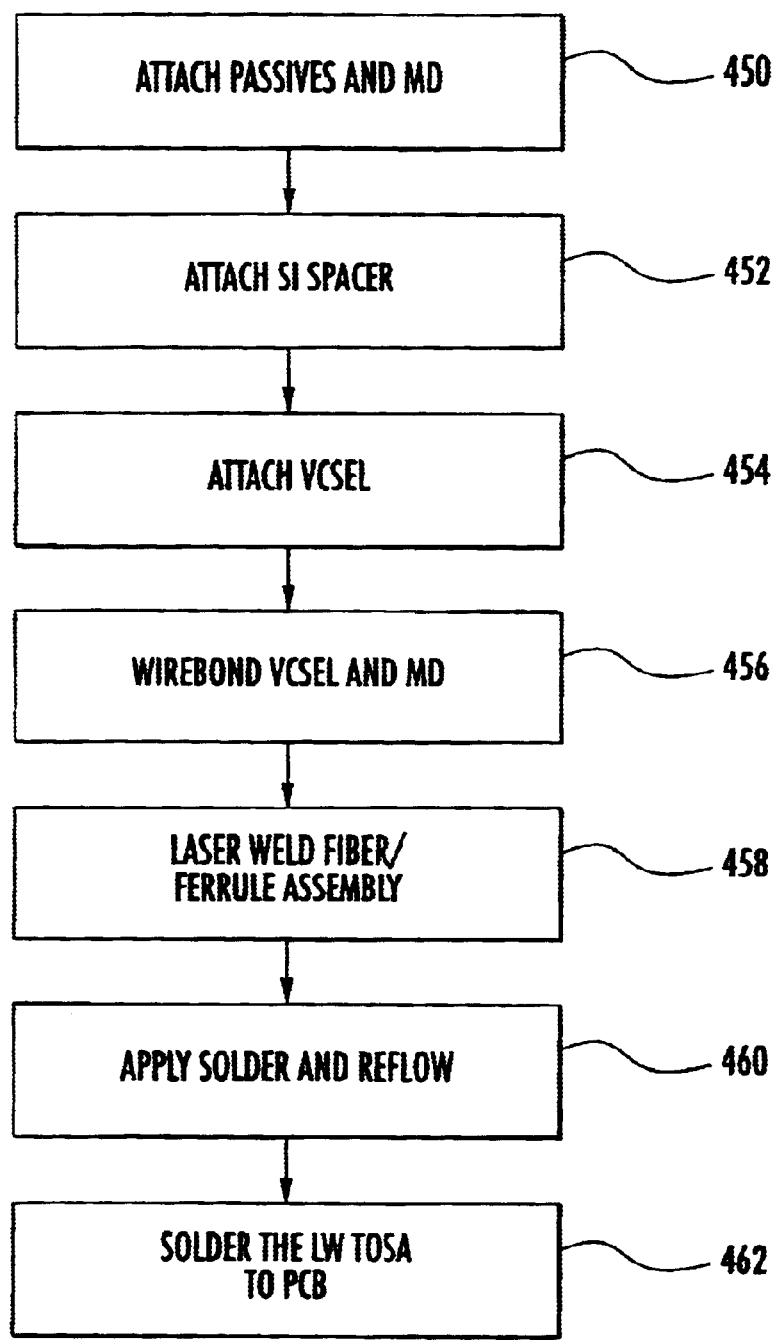
FIG. 8 is a flow diagram illustrating a process of 1assembling the exemplary TOSA of FIG. 7.

FIG. 8 is a flow diagram illustrating a process of fabricating the exemplary TOSA 400 on the ceramic substrate 402 having the above-mentioned layers. In step 450, 0201 passive components 416 and a monitor photodiode 414 are attached to the monitor diode layer 404 using a suitable, commercially available adhesive. For example, the adhesive used may be AbleStik™71-1 available from Ablestik Laboratories, Rancho Dominguez, Calif., a component of National Starch and Chemical Company, Bridgewater, N.J. When AbleStik 71-1 is used, it may be cured at 150° C. for 30 minutes and at 275° C. for 30 minutes after the application. Ablestik™ is a trademark of National Starch and Chemical Company, Bridgewater, N.J.

In step 452, a silicon spacer 418 is attached to the monitor photodiode 414 using a suitable, commercially available adhesive, which may be transparent and non-conductive epoxy. For example, the adhesive used may be AbleStik RP-621 available from National Starch and Chemical Company, Bridgewater, N.J. When AbleStik RP-621 is used, it may be cured at 100° C. for 30 minutes. In step 454, a VCSEL 420 is attached to the silicon spacer 418 using a suitable adhesive, such as AbleStik RP-621.

In step 456, the VCSEL 420 and the monitor photodiode 414 are wirebonded to the ceramic substrate via the wire bond shelf 406, using suitable, commercially available wires 422, such as, for example, 0.8 mil gold (Au) wires. At this point, the uncompleted LW TOSA may be staged at 120° C. for 15 minutes. In step 458, the weld sleeve 426 is welded to the ferrule 424 at weld spots 428; then the weld sleeve 426 is welded to the seal ring 410 at weld spots 429. A suitable distance should be maintained between an optical fiber 425 in the ferrule 424 and the VCSEL 420 such that the optical fiber 425 does not touch the bonding wires 422.

In step 460, solder 430 is applied to the seam between the ferrule 424 and the weld sleeve 426, and between the weld sleeve 426 and the seal ring 410 and re-flown to create hermetic sealing for the fiber/ferrule assembly. In other exemplary embodiments, the hermetic sealing may be created through laser welding or any other suitable sealing method.

For example, when laser welding is used for hermetic sealing, a pulse laser (e.g., YAG laser) may be used to weld a spot, then the fiber/ferrule assembly may be rotated by, for example, one half of the diameter of the weld spots to weld again, until a hermetic sealing is achieved. A non-pulse (e.g., continuous wave) laser may also be used for hermetic sealing through laser welding. In still other exemplary embodiments, silicone or another adhesive may be used for hermetic sealing instead of solder. In step 462, the pins 412 are solder mounted to a PCB, so that the fiber/ferrule assembly is mounted at an edge of the PCB.

The transmitter optical sub-assembly (TOSA) in embodiments of the present invention may provide numerous advantages over currently existing TOSAs. First, measurements show that the TOSA is capable of supporting transmission at a data rate of at least 10 Gbps unlike the conventional TO-based OSAs. The TOSA is also significantly more cost-effective than industry-standard "butterfly" packages.

In addition, the TOSA in embodiments of the present invention may have high optical coupling efficiency between the VCSEL and the single mode optical fiber. This means the TOSA may not require use a lens to transform the laser beam from the laser to the single mode optical fiber, thereby further reducing cost.

Further, the TOSA may enable power monitoring for the purpose of automatic power control while providing an efficient thermal path (silicon spacer) in order to remove heat from the VCSEL, thus promoting long device lifetime. Using the present invention, the laser (e.g., VCSEL) does not require an optical isolator to ensure low relative intensity noise (RIN), thereby further lowering the cost of the TOSA. Also, the TOSA may be assembled using laser welders designed for "coaxial packages". The TOSA may also provide hermetic sealing of the VCSEL and monitor photodiode by soldering the weld sleeve to the seal ring and the ferrule to the weld sleeve. The TOSA may allow easy device testing and mounting on a printed circuit board.

Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents.

For example, while the described exemplary embodiments of the present invention comprise TOSA, the principles of the present invention are just as applicable to a receiver optical subassembly (ROSA). For example, the ceramic substrate may have a receiver photodiode and a transimpedance amplifier (TIA) mounted thereon rather than a VCSEL and/or monitor photodiode.

I claim:

1. An optical subassembly (OSA) comprising:
   a ferrule;
   an optical fiber disposed within the ferrule;
   a ceramic substrate;
   a seal coupled to the ceramic substrate; and
   a weld sleeve coupled to the seal and the ferrule.

2. The OSA according to claim 1, wherein said OSA is a transmitter optical subassembly (TOSA) comprising at least one vertical cavity surface emitting laser (VCSEL) mounted over the ceramic substrate for optical communication with the optical fiber.

3. The OSA according to claim 2, further comprising a monitor photodiode mounted on the ceramic substrate and a spacer mounted on the monitor photodiode, wherein the VCSEL is mounted on the spacer, the spacer being substantially transparent at the wavelength of an optical output that the VCSEL is capable of generating.

4. The OSA according to claim 3, wherein the spacer is capable of dissipating heat generated by the VCSEL.

5. The OSA of claim 1, wherein the weld sleeve is fixably coupled to the ferrule via laser welding.

6. The OSA of claim 5, wherein the weld sleeve is fixably coupled to the seal via laser welding.

7. The OSA according to claim 1, wherein an end-face of the optical fiber proximate the VCSEL is cleaved at an angle with respect to an emitting surface of the VCSEL.

8. The OSA according to claim 7, wherein the optical fiber is cleaved at an angle between approximately 3 degrees and approximately 10 degrees.

9. The OSA according to claim 1, wherein the ferrule, the optical fiber, the ceramic substrate, the seal and the weld sleeve define a hermetically sealed chamber.

10. The OSA according to claim 1, wherein the ceramic substrate is fabricated from a material selected from a group consisting of a low-temperature co-fired ceramic (LTCC) and a high-temperature co-fired ceramic (HTCC).

11. The OSA according to claim 1, wherein the OSA is a receiver optical subassembly (ROSA) comprising a photodiode mounted on the ceramic substrate for optical communication with the optical fiber.

12. The OSA according to claim 1, wherein the ceramic substrate is formed of a microwave-capable ceramic material.

13. The OSA according to claim 1, wherein the seal is fabricated form a material having substantially the same thermal expansion coefficient as the ceramic substrate.

14. An optical subassembly (OSA) comprising:
   a ferrule having a substantially cylindrical shape;
   a weld sleeve comprising a substantially cylindrical member, which is co-axial to and at least partially envelopes the ferrule, said weld sleeve further comprising a flange on one end, wherein the weld sleeve is capable of being laser welded to the ferrule;
   a microwave-capable ceramic substrate; and
   a seal mounted on the microwave-capable ceramic substrate, said seal capable of being laser welded to the flange.

15. The OSA according to claim 14, wherein said OSA is hermetically sealed.

16. A transmitter optical subassembly (TOSA) comprising:
   a ceramic substrate;
   a VCSEL mounted on the ceramic substrate, the VCSEL positioned to emit light substantially perpendicular to the surface of the ceramic substrate on which the VCSEL is mounted;
   a ferrule: and
   an optical fiber disposed within the ferrule, the ferrule positioned such that an end face of the optical fiber receives light emitted by the VCSEL, said end face of said optical fiber proximate an emitter surface of said VCSEL.

17. A method of assembling an optical subassembly (OSA), the method comprising:
   coarsely aligning an optical fiber with a VCSEL in at least an X-Y direction, wherein the optical fiber is hermetically sealed to a ferrule and the VCSEL is mounted on a ceramic substrate, said ceramic substrate having a seal mounted thereon;
   adjusting a distance between the optical fiber and the VCSEL in a z direction until sufficient coupling efficiency is achieved;
   sliding a weld sleeve over the ferrule to position the weld sleeve on the seal ring;
   laser welding the weld sleeve to the ferrule, thereby fixing a distance between the optical fiber and the VCSEL in the Z direction;
   finely aligning the optical fiber to the VCSEL in at least the X-Y direction; and
   laser welding the weld sleeve to the seal ring.

18. The method according to claim 17, further comprising hermetically sealing the OSA.

19. The method according the claim 18, wherein hermetically sealing comprises laser welding at least one of a seam between the weld sleeve and the ferrule and a seam between the weld sleeve and the seal ring.

20. The method according the claim 18, wherein hermetically sealing comprises solder sealing at least one of a seam between the weld sleeve and the ferrule and a seam between the weld sleeve and the seal ring.

21. The method according the claim 17, wherein at least one of the coarsely aligning, adjusting the distance, and finely aligning comprises active aligning.

22. The method according to claim 17, wherein laser welding comprises applying three 120 degree spaced laser beams substantially simultaneously.

23. The method according to claim 17, wherein adjusting the distance comprises adjusting the distance until a beam width of the VCSEL is less than a predetermined width.

24. The method according to claim 17, wherein adjusting the distance comprises adjusting the distance until a detected power of the VCSEL is greater than a predetermined power level.

* * * * *